United States Patent
Mallikarjunaswamy

(10) Patent No.: US 7,064,407 B1
(45) Date of Patent: Jun. 20, 2006

(54) JFET CONTROLLED SCHOTTKY BARRIER DIODE

(75) Inventor: Shekar Mallikarjunaswamy, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 113 days.

(21) Appl. No.: 11/051,520

(22) Filed: Feb. 4, 2005

(51) Int. Cl.
*H01L 27/095* (2006.01)
*H01L 29/47* (2006.01)
*H01L 29/812* (2006.01)
*H01L 31/07* (2006.01)
*H01L 31/108* (2006.01)

(52) U.S. Cl. ............... 257/471; 257/477; 257/486; 257/287

(58) Field of Classification Search ............... None
See application file for complete search history.

(56) References Cited

U.S. PATENT DOCUMENTS

| 4,801,983 | A | 1/1989 | Ueno et al. |
| 5,258,640 | A | 11/1993 | Hsieh et al. |
| 5,430,323 | A | 7/1995 | Yamazaki et al. |
| 6,261,932 | B1 * | 7/2001 | Hulfachor .......... 438/570 |

OTHER PUBLICATIONS

Linear Technology Data Sheet for LT3464, "Micropower Boost Converter with Schottky and Output Disconnect in ThinSOT™," pp. 1-16.
Micrel Data Sheet for MIC2290, "2mmX2mm PWM Boost Regulator with Internal Schotty Diode," Aug. 2004, pp. 1-12.
Micrel Data Sheet for MIC2288, "1A 1.2PWM Boost Converter in Thin SOFT-23 AND 2X2 MLF™," Aug. 2004, pp. 1-12.

* cited by examiner

*Primary Examiner*—Tu-Tu Ho
(74) *Attorney, Agent, or Firm*—Patent Law Group LLP; Carmen C. Cook

(57) ABSTRACT

A JFET controlled Schottky barrier diode includes a p-type diffusion region integrated into the cathode of the Schottky diode to form an integrated JFET where the integrated JFET provides on-off control of the Schottky barrier diode. The p-type diffusion region encloses a portion of the forward current path of the Schottky barrier diode where the p-type diffusion region forms the gate of the JFET and the enclosed portion of the forward current path forms the channel region of the JFET. By applying a reverse biased potential to the gate of the JEFT with respect to the anode of the Schottky diode, the forward current of the Schottky diode can be pinched off, thereby providing on-off control over the Schottky diode forward current.

15 Claims, 3 Drawing Sheets

JFET CONTROLLED SCHOTTKY BARRIER DIODE

FIELD OF THE INVENTION

The invention relates to a Schottky barrier diode with turn-off control and, in particular, to a Schottky barrier diode incorporating a JEFT for controlling the on-off state of the Schottky diode.

DESCRIPTION OF THE RELATED ART

A Schottky barrier diode (or a "Schottky diode") is formed by a metal-semiconductor junction. A barrier metal is deposited on the surface of a lightly doped N-type or P-type semiconductor to form the diode junction. For example, aluminum can be deposited on the surface of a lightly doped N-type semiconductor to form a Schottky barrier diode. The barrier metal contacting the N-type semiconductor forms the anode of the Schottky diode. The cathode of the Schottky diode is formed by an N+ region in electrical contact with the lightly doped semiconductor region. A Schottky barrier diode is characterized by a low forward voltage as compared to traditional p-n junction diodes. Conventional Schottky diodes conduct in forward mode whenever the anode to cathode voltage exceeds the metal to semiconductor barrier potential.

FIG. 1 is a cross-sectional view of a conventional Schottky diode. Schottky diode 10 is formed in an N-type epitaxial layer 18 (N-Epi 18) on a P-type substrate 12. The anode of Schottky diode 10 is formed by an enlarged aluminum contact 14 while the cathode is formed by an N-Well 16 in N-Epi 18. Electrical contact to the cathode is provided by an N-type buried layer (N-BL) 20, an N-type sinker region 22 and an N+ region 24. A metal electrode 26 is typically provided to form an ohmic contact to N+ region 24. In operation, the forward current for Schottky diode 10 flows from the anode (aluminum contact 14) into N-well 16, N-Epi 18 and N-BL 20 where the forward current is collected by N-type sinker region 22. In conventional Schottky diode 10, the N-sinker region in conjunction with the N-type buried layer is used to reduce the series cathode resistance of the Schottky diode.

Schottky diodes are typically used in electronic applications to provide rectification. For example, Schottky diodes are used in voltage converters to rectify the switched output voltage of the voltage converter. For instance, in a non-synchronous, step-up or boost converter, a Schottky diode is connected to the switched output voltage in such a way as to form a direct DC current path from the switched output voltage to the load. However, when the voltage converter is not being used, the DC current path remains which results in undesirable current flow through the Schottky diode to the output load. Therefore, in some voltage converters applications, it is desirable to disconnect the input voltage applied to the anode of the Schottky diode or disconnect the cathode driving the load to eliminate the leakage current path. More specifically, a boost converter includes an inductor connected between the supply voltage and the anode of the Schottky diode. When the output boost voltage at the cathode is about the same as the supply voltage, the Schottky diode starts to conduct, resulting in leakage current.

One solution used in the industry is to use synchronous rectification by using an N-channel MOSFET instead of the Schottky diode. But synchronous rectification requires additional level shifting and driving circuitry for the NMOSFET that impacts the efficiency of the voltage converter at higher voltages. Another solution is to use a switch to disconnect the Schottky diode from the output load. Both of these solutions having shortcomings.

Therefore, a Schottky diode that is capable of both forward and reverse blocking is desired.

SUMMARY OF THE INVENTION

According to one embodiment of the present invention, a JFET controlled Schottky barrier diode includes a p-type diffusion region integrated into the cathode of the Schottky diode to form an integrated JFET where the integrated JFET provides on-off control of the Schottky barrier diode. The p-type diffusion region encloses a portion of the forward current path of the Schottky barrier diode where the p-type diffusion region forms the gate of the JFET and the enclosed portion of the forward current path forms the channel region of the JFET. By applying a reverse biased potential to the gate of the JEFT with respect to the anode of the Schottky diode, the forward current of the Schottky diode can be pinched off, thereby providing on-off control over the Schottky diode forward current.

According to one embodiment of the present invention, a JFET controlled Schottky diode includes a semiconductor layer of N-type conductivity, a first region of N-type conductivity formed in the semiconductor layer where the first region is lightly doped and forms the cathode region of the Schottky diode, and a second region of N-type conductivity formed in the semiconductor layer where the second region is heavily doped and is electrically coupled to the first region through the semiconductor layer and one or more diffusion regions formed in the semiconductor layer. The second region forms the cathode terminal of the Schottky diode where a forward current path of the Schottky diode is formed between the first region and the second region. The JFET controlled Schottky diode further includes a barrier metal electrode formed on the top surface of the semiconductor layer and above the first region where the barrier metal electrode is in ohmic contact with the first region and thereby forming a Schottky junction with the first region. The barrier metal electrode forms the anode terminal of the Schottky diode. The JFET controlled Schottky diode further includes a third region of P-type conductivity formed in the semiconductor layer and enclosing a portion of the forward current path of the Schottky diode between the first region and the second region. The third region forms the gate of the JFET and the enclosed portion of the forward current path forms the channel region of the JFET. Finally, a first metal electrode is formed on the top surface of the semiconductor layer and is electrically coupled to the third region where the first metal electrode forms a gate terminal of the JFET.

In operation, the forward current path of the Schottky diode is put in a conducting state by the application of a voltage to the gate terminal relative to the anode terminal that is equal to or greater than the pinch-off voltage of the JFET. On the other hand, the forward current path of the Schottky diode is put in a non-conducting state by the application of a voltage to the gate terminal relative to the anode terminal that is less than the pinch-off voltage of the JFET.

The present invention is better understood upon consideration of the detailed description below and the accompanying drawings.

DETAILED DESCRIPTION OF THE PREFERRED EMBODIMENTS

In accordance with the principles of the present invention, a Schottky barrier diode includes an integrated junction field-effect transistor (JFET) for providing on-off control of the Schottky barrier diode. The Schottky barrier diode thus formed is referred herein as a "JFET Controlled Schottky Diode." Specifically, a p-type diffusion region is integrated into the cathode of the Schottky diode to realize a reverse biased p-n junction where the p-n junction operates to pinch off the forward current of the Schottky diode using JFET action. By applying a reverse biased potential to the integrated JEFT with respect to the anode, on-off control over the Schottky diode forward current is realized.

Figure 1:
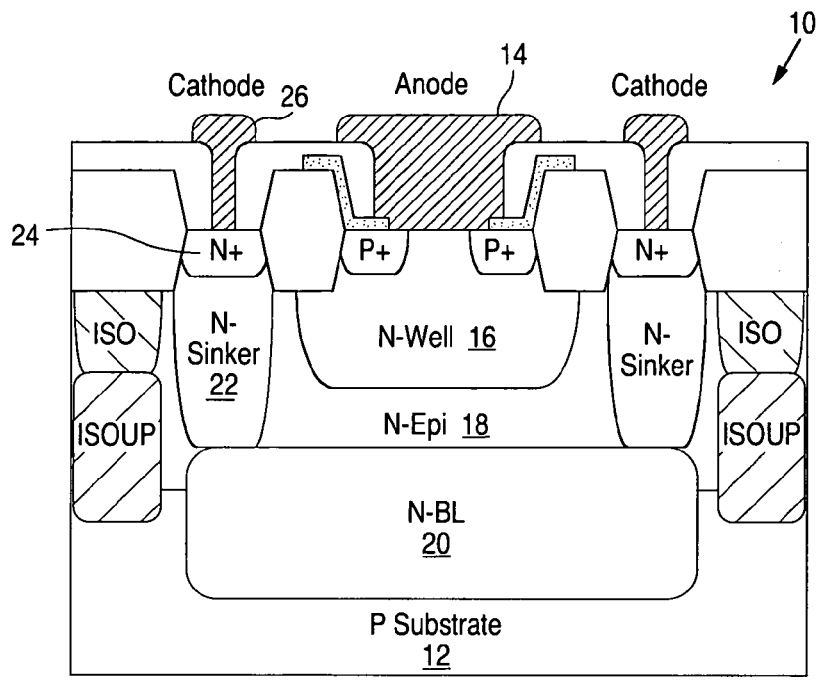
FIG. 1 is a cross-sectional view of a conventional Schottky diode.
Figure 2:
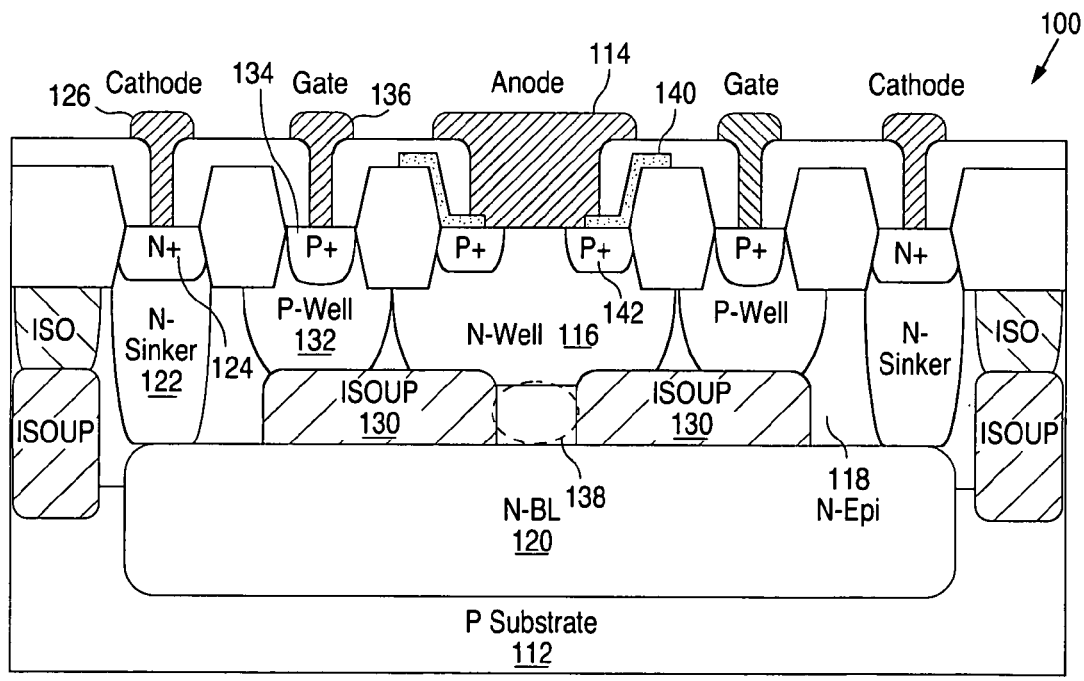
FIG. 2 is a cross-sectional view of a JFET controlled Schottky diode according to one embodiment of the present invention.
Figure 3:
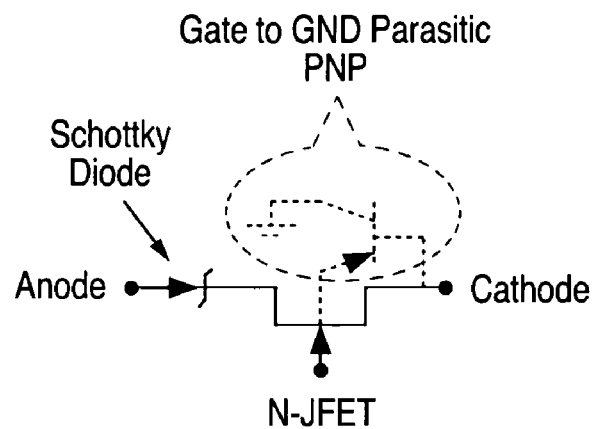
FIG. 3 is the equivalent circuit of the JFET controlled Schottky diode of FIG. 2.

FIG. 2 is a cross-sectional view of a JFET controlled Schottky diode according to one embodiment of the present invention. The equivalent circuit of the JFET controlled Schottky diode is shown in FIG. 3. Referring to FIG. 2, JFET controlled Schottky diode 100 (hereinafter "Schottky diode 100") is formed in an N-type epitaxial layer 118 (N-Epi 118) on a p-type substrate 112. The anode of Schottky diode 100 is formed by an enlarged metal contact (such as aluminum) 114 while the cathode is formed by an N-Well 116 in N-Epi 118. Specifically, the metal contact is in ohmic contact with the semiconductor layer containing the N-Well to form the Schottky junction. Electrical contact to the cathode is provided by an N-type buried layer 120 (N-BL 120), an N-type sinker region 122 and an N+ region 124. A metal electrode 126 is provided to form an ohmic contact to N+ region 124. The metal electrode 126 thus forms the cathode terminal of the Schottky diode. In the cross-sectional view of FIG. 2, N-type sinker region 122 is shown as being formed on both sides of N-Well 116. In actual implementation, the N-type sinker region 122 is typically formed as a ring encircling the N-Well. The N-sinker region 122 and the N-type buried layer 120 are used to reduce the series cathode resistance of the Schottky diode. N-sinker region 122 and N-type buried layer 120 are optional and in other embodiments, other means for providing an electrical contact to the cathode (N-Well 116) of the Schottky diode can be used, including contacts that are formed on the backside of the silicon substrate.

The forward current path for Schottky diode 100 flows from the anode (aluminum contact 114) into N-well 116, though N-Epi 118 and into N-BL 120 where the forward current is collected by N-type sinker region 122. The forward current can then flow through N+ region 124 to the cathode electrode 126. Without the integrated JFET, Schottky diode 100 operates as a conventional Schottky diode and conducts forward current when the anode to cathode voltage exceeds the metal to semiconductor barrier potential.

In Schottky diode 100, an N-channel JFET (N-JFET) is integrated into the cathode of the Schottky diode. As thus formed, the anode and cathode terminals of Schottky diode 100 is connected in series with the source-drain terminals of the integrated N-JFET so that the gate terminal of the N-JFET acts as a control electrode for controlling the on-off state of the Schottky diode. It is well understood that an N-channel JFET includes a p-type diffusion region as the gate and an N-type diffusion region as the channel which is the conducting region connecting the source and drain which are also N-type diffusion regions. In a JFET, the gate diffusion region encircles the channel region so that the gate voltage modulates the current flowing between the source and the drain.

Referring to FIG. 2, the gate of integrated N-JFET is formed by a P-Well 132 contacting a p-type diffusion region 130 which is a p-type ISOUP region in the present embodiment. A p+ diffusion region 134 is formed in P-Well 132 to provide an ohmic contact to the P-Well and a metal electrode 136 contacts p+ diffusion region 134 to function as the gate electrode of the integrated N-JFET. In the present embodiment, Schottky diode 100 is illustrated as being fabricated using a BCD (bipolar-CMOS-DMOS) process and thus the p-type ISOUP diffusion region of the BCD process is used to form the p-type diffusion region 130. In other embodiments, other p-type diffusion region in the fabrication process or a dedicated p-type diffusion region in the fabrication process can be used to form the gate diffusion region of the N-JFET. For example, the JFET controlled Schottky diode of the present invention can be fabricated in a CMOS, bipolar or a BiCMOS process.

In the cross-sectional view of FIG. 2, P-Well 132 is shown as two separate diffusion regions but in actual implementation, P-Well 132 is a continuous diffusion region formed in a ring shape or other closed shape enclosing N-Well 116. Similarly, ISOUP region 130 is shown as two separated diffusion regions but in actual implementation, ISOUP region 130 is a continuous diffusion region formed in a ring shape or other closed shape to enclose the channel region of the JFET. As thus formed, ISOUP region 130 encloses a portion 138 of N-Well 116 and N-Epi 118 near the bottom of N-Well 116 and above N-BL 120 where portion 138 forms the channel region of the integrated N-JFET. The channel region (portion 138) of N-JFET is part of the forward current path through the cathode region (N-well 116) of Schottky diode 100. The source of the integrated N-JFET is formed by the region of N-Well 116 above the channel region (portion 138) and the drain is formed by N-BL 120. In the integrated JFET formed in Schottky diode 100, the spacing between the ISOUP regions 130 (which is the diameter of the enclosed portion 138) and the N-Well/N-Epi doping concentrations determine the pinch-off voltage of the JFET.

As thus constructed, Schottky diode 100 integrates an N-type JFET at the cathode of the metal-semiconductor diode which operates to block forward current conduction when the appropriate gate voltage is applied. The equivalent circuit for JFET controlled Schottky diode 100 is shown in FIG. 3. As shown in FIG. 3, the metal-semiconductor junction forms a Schottky diode denoted by the conventional Schottky diode symbol. The N-JFET is integrated into the cathode of the Schottky diode where the source and drain terminals of the JFET are in series with the cathode of the Schottky diode. In this manner, application of the appropriate gate voltage to the N-JFET will cause the current path through the cathode to be connected or disconnected, thereby allowing or blocking the forward current through the Schottky diode.

As a result of the integration of the N-channel JFET in Schottky diode 100, a parasitic PNP bipolar transistor is formed as shown in the equivalent circuit of FIG. 3. Specifically, the parasitic PNP bipolar is formed by the gate of the N-JFET (ISOUP region 130) as the emitter, the N-BL 120 as the base and the P-substrate 112 as the collector. The heavily doped N-type buried layer (N-BL 120) reduces the gain of the parasitic PNP bipolar transistor.

Figure 4:
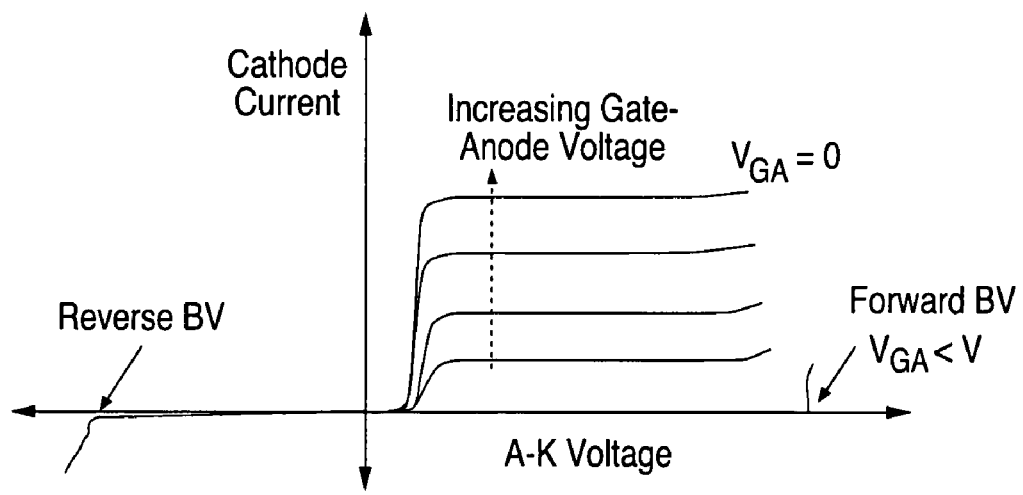
FIG. 4 illustrates the I-V characteristics of the JFET controlled Schottky diode according to one embodiment of the present invention.

The operation of JFET controlled Schottky diode 100 will now be described with reference to FIG. 4 which illustrates the I-V characteristics of the Schottky diode. Referring to FIG. 4, when the gate to anode voltage (VGA) is zero, the JFET channel is conducting and the Schottky diode enters forward conduction mode when the anode to cathode voltage (A-K voltage) exceeds the Schottky diode barrier height. In the forward conduction mode, electrons flow from the cathode terminal 126 via N-type sinker region 122 into N-BL 120. Because the JFET channel is conducting, electrons flow through the channel region (portion 138) of the JFET formed in N-Epi 118 into N-well 116. The electrons then flow into the metal contact 114 forming the anode terminal of the Schottky diode. At increasing anode to cathode (A-K) voltages, the Schottky current saturates as the depletion region from the gate (ISOUP 130) of the JFET extends into N-Well 116 due to increasing gate to cathode reverse bias potential where the reverse bias potential pinches off the JFET channel for electron flow.

By applying a reverse bias potential between the gate to anode terminal (that is, a negative VGA voltage), the JFET channel resistance can be modulated and the Schottky forward current can be controlled as shown in FIG. 4. When the gate to anode potential (voltage $V_{GA}$) is reduced to below the pinch-off voltage ($V_P$) of the JFET, the JFET is cutoff where the JFET channel is in a non-conducting state. The Schottky diode is thus put in its forward blocking state where regardless of the anode to cathode (A-K) voltage, no electrons flow through the cathode of the Schottky diode into the anode terminal.

The Schottky diode provides reverse blocking itself when the anode to cathode potential is negative. During reverse blocking, the gate of the JFET can be connected to anode or biased to maintain reverse bias between gate to anode and gate to cathode.

In JFET controlled Schottky diode 100 of FIG. 2, a polysilicon field plate 140 and a p+ diffusion region 142 in the N-Well 116 surround the perimeter of the Schottky junction. P+ diffusion region 142 forms a guard ring surrounding the Schottky junction. The P+ guard ring operates to reduce surface leakages at the edges of the anode metal due to high electric fields. Polysilicon field plate 140 reduces the surface electric field between the P+ and N-well junction which has the effect of reducing the reverse leakage while improving the reverse breakdown voltage of the Schottky diode. The polysilicon field plate 140 and the p+region 142 are optional.

Figure 5:
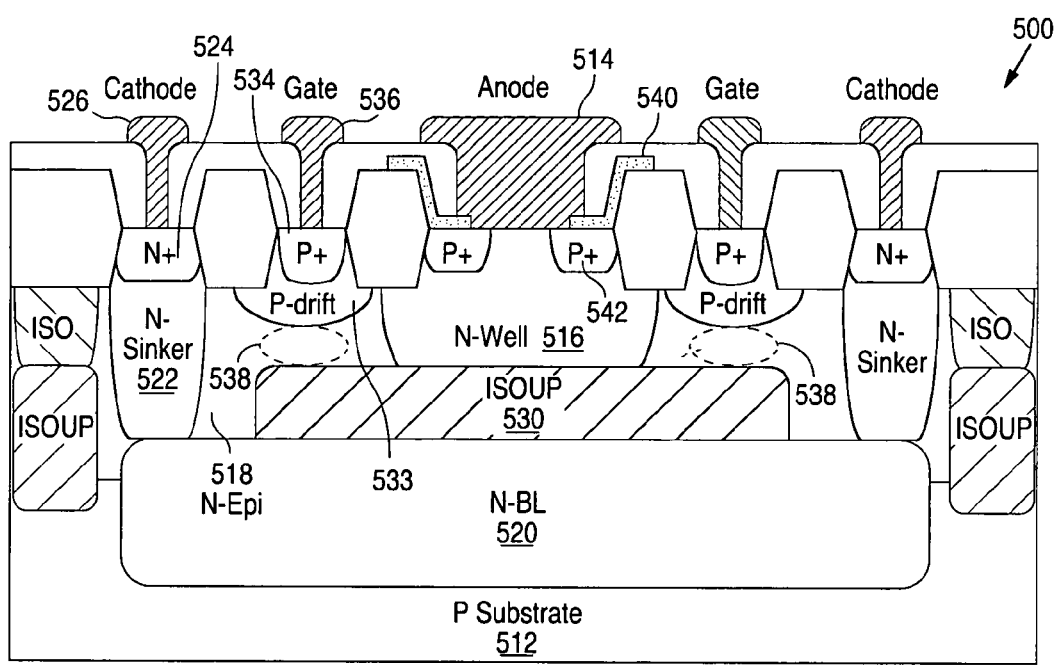
FIG. 5 is a cross-sectional view of a JEFT controlled Schottky diode according to an alternate embodiment of the present invention.

In the embodiment shown in FIG. 2, Schottky diode 100 integrates a vertical JFET for on-off control. In other words, the source and drain terminals of the integrated JFET, and therefore the conduction channel, lie in the vertical axis of the JFET. In other embodiments, a lateral JFET can be integrated in the Schottky diode of the present invention to provide the on-off control function. FIG. 5 is a cross-sectional view of a JEFT controlled Schottky diode according to an alternate embodiment of the present invention. In the embodiment shown in FIG. 5, a lateral JFET having a conduction channel that lies in the horizontal axis of the JFET is integrated into the cathode of a Schottky diode to form a JFET controlled Schottky diode.

Referring to FIG. 5, JFET controlled Schottky diode 500 (hereinafter "Schottky diode 500") is formed in an N-type epitaxial layer 518 (N-Epi 518) on a p-type substrate 512. The anode of Schottky diode 100 is formed by an enlarged metal contact (such as aluminum) 514 while the cathode is formed by an N-Well 516 in N-Epi 518. Electrical contact to the cathode is provided by an N-type buried layer 520 (N-BL 520), an N-type sinker region 522 and an N+region 524. A metal electrode 526 is provided to form an ohmic contact to N+ region 524. The metal electrode 526 thus forms the cathode terminal of the Schottky diode. The N-sinker region 522 and the N-type buried layer 520 are used to reduce the series cathode resistance of the Schottky diode. In the cross-sectional view of FIG. 5, N-type sinker region 522 is shown as being formed on both sides of N-Well 516. In actual implementation, the N-type sinker region 522 is typically formed as a ring encircling the N-Well.

In the present embodiment, N-Well 516 is separated from N-BL 520 by an ISOUP region 530 for forming the lateral N-JFET. Therefore, the forward current path for Schottky diode 100 has a lateral component where the current flows from the anode (aluminum contact 514) into N-well 516 and laterally through N-Epi 518 into N-BL 520 where the forward current is collected by N-type sinker region 522. The forward current flowing laterally through N-Epi 518 can also be collected directly by N-type sinker region 522. Once collected by the sinker region, the forward current can then flow through N+ region 524 to the cathode electrode 526. Without the integrated JFET, Schottky diode 500 operates as a conventional Schottky diode and conducts forward current when the anode to cathode voltage exceeds the metal to semiconductor barrier potential.

In Schottky diode 500, a lateral N-channel JFET (N-JFET) is integrated into the cathode of the Schottky diode. As thus formed, the anode and cathode terminals of Schottky diode 500 is connected in series with the source-drain terminals of the integrated N-JFET so that the gate terminal of the N-JFET acts as a control electrode for controlling the on-off state of the Schottky diode. Referring to FIG. 5, the gate of integrated N-JFET is formed by a first p-type diffusion region 533 which is a P-drift diffusion region in the present embodiment and a second p-type diffusion region 530 which is a p-type ISOUP region in the present embodiment. A p+ diffusion region 534 is formed in P-drift diffusion region 533 to provide an ohmic contact to the P-drift region and a metal electrode 536 contacts p+ diffusion region 534 to function as the gate electrode of the integrated N-JFET.

In the present embodiment, a shallow P-drift diffusion region is used to form one end of the gate region of the lateral N-JFET. In the present description, the P-drift diffusion region is the diffusion region used to form the body region of an LDMOS transistor. Furthermore, in the present embodiment, the p-type ISOUP diffusion region is used to form the other end of the gate region of the lateral N-JFET. In other embodiments, other p-type diffusion regions in the fabrication process or dedicated p-type diffusion regions in the fabrication process can be used to form the gate diffusion regions (the first and second p-type diffusion regions 533 and 530). The embodiment shown in FIG. 5 illustrates how the JFET-controlled Schottky diode can be incorporated in an existing fabrication process by employing diffusion regions and layers that are available in the fabrication process.

ISOUP region 530, being part of the gate region of the N-JFET, is connected to the P-drift diffusion region 533 along a third dimension of Schottky diode 500 (not shown). That is, if the cross-sectional view of FIG. 5 is denoted as having an x-axis as the horizontal axis and an y-axis as the vertical axis, then ISOUP region 530 is connected to the P-drift diffusion region 533 along a z-axis perpendicular to both the x-axis and the y-axis. For example, the ISOUP region 530 can be connected to P-drift diffusion region 533 through a P-well (not shown) connecting the ISOUP region and the P-drift diffusion region in the z-axis.

In the cross-sectional view of FIG. 5, P-drift region 533 is shown as two separated diffusion regions but in actual implementation, P-drift diffusion region 533 is a continuous diffusion region formed in a ring shape or other closed shape enclosing N-Well 516. As thus formed, P-drift diffusion region 533 and ISOUP region 530 enclose a portion 538 of N-Epi 518 between N-Well 516 and N-type sinker region 522 where portion 538 forms the channel region of the integrated N-JFET. The channel region (portion 538) of N-JFET is part of the forward current path through the cathode region (N-well 516) of Schottky diode 500. The source of the integrated N-JFET is formed by N-Well 516 and the drain is formed by remaining portion of N-Epi not enclosed by P-drift region 533 and ISOUP region 530 as well as the N-BL 520 and the N-type sinker region 522. In the integrated JFET formed in Schottky diode 500, the spacing between P-drift diffusion region 533 and ISOUP regions 530 (which is the vertical distance of the enclosed portion 538) and the N-Epi doping concentrations determine the pinch-off voltage of the JFET.

As thus constructed, Schottky diode 500 integrates a lateral N-type JFET at the cathode of the metal-semiconductor diode which operates to block forward current conduction when the appropriate gate voltage is applied. Schottky diode 500 operates in the same manner as Schottky diode 100 of FIG. 2. Basically, the application of the appropriate gate voltage relative to the anode terminal will cause the current path through the cathode to be connected or disconnected, thereby allowing or blocking the forward current through the Schottky diode. In the lateral JFET of FIG. 5, the forward current path is lateral through the channel region of the N-JFET and the gate region (P-drift 533 and ISOUP region 530) pinches of the channel vertically when the reverse bias voltage applied to the gate and anode terminals (that is, a negative VGA voltage) is less than the pinch-off voltage of the lateral JFET.

In JFET controlled Schottky diode 500 of FIG. 5, a polysilicon field plate 540 and a p+ diffusion region 542 in the N-Well 516 as a guard ring structure surrounding the perimeter of the Schottky junction. The polysilicon field plate 540 and the p+ region 542 are optional.

In yet another embodiment, a JFET controlled Schottky diode can incorporate a JFET that includes a lateral conduction channel and a vertical conduction channel by incorporating the structure of the JFET as shown in FIGS. 2 and 5. The resultant JFET has a higher channel density per unit area that a vertical and a lateral JFET alone which translates into a lower forward drop for the same current density.

In summary, the JFET controlled Schottky diode of the present invention is formed by integrating one or more p-type diffusion regions in a Schottky diode structure where the p-type diffusion regions enclose at least a portion of the forward current path of the Schottky diode. The p-type diffusion regions form the gate of a JFET where the enclosed portion of the forward current path forms the channel region of the JFET. The gate and the channel region form a p-n junction where the conduction state of the channel region can be controlled by application of a reverse biased voltage across the p-n junction. Thus, through JFET action controlling the conduction state of the channel region, the forward current path of the Schottky diode can be selectively connected or disconnected to turn the Schottky diode on or off. The JFET controlled Schottky diode of the present invention is formed by integrating a single type (p-type) of diffusion regions into the Schottky diode structure, thereby allowing a gated Schottky diode to be formed in a small silicon area.

The JFET controlled Schottky diode in accordance with the present invention realizes both forward current blocking and reverse current blocking. Therefore, the JFET controlled Schottky diode of the present invention can be applied advantageously in applications where a Schottky diode with on-off control is required. The JFET controlled Schottky diode of the present invention is turned on by the application of a gate to anode voltage equal to or greater than the pinch-off voltage. When enabled, the JFET controlled Schottky diode operates as a conventional Schottky diode. However, the JFET controlled Schottky diode of the present invention can be turned off by the application of a gate to anode voltage that is less than the pinch-off voltage. In that case, regardless of the anode to cathode voltage, the Schottky diode is disabled and no forward current will be passed. The JFET controlled Schottky diode has particular applications in voltage converters for portable devices where the Schottky diode can be turned off to cut off the leakage current path through the Schottky diode. In this manner, the power supply, such as a battery, of the portable device is not drained off and the battery-life of the portable device can be extended.

The above detailed descriptions are provided to illustrate specific embodiments of the present invention and are not intended to be limiting. Numerous modifications and variations within the scope of the present invention are possible. The present invention is defined by the appended claims.

I claim:

1. A JFET controlled Schottky diode comprising:
   a semiconductor layer of N-type conductivity;
   a first region of N-type conductivity formed in the semiconductor layer, the first region being lightly doped and forming the cathode region of the Schottky diode;
   a second region of N-type conductivity formed in the semiconductor layer, the second region being heavily doped and being electrically coupled to the first region through the semiconductor layer and one or more diffusion regions formed in the semiconductor layer, the second region forming the cathode terminal of the Schottky diode where a forward current path of the Schottky diode is formed between the first region and the second region;
   a barrier metal electrode formed on the top surface of the semiconductor layer and above the first region, the barrier metal electrode being in ohmic contact with the first region and thereby forming a Schottky junction with the first region, the barrier metal electrode forming the anode terminal of the Schottky diode;
   a third region of P-type conductivity formed in the semiconductor layer and enclosing a portion of the forward current path of the Schottky diode between the first region and the second region, the third region forming the gate of the JFET and the enclosed portion of the forward current path forming the channel region of the JFET; and a first metal electrode formed on the top surface of the semiconductor layer and electrically coupled to the third region, the first metal electrode forming a gate terminal of the JFET, wherein the forward current path of the Schottky diode is put in a conducting state by the application of a voltage to the gate terminal relative to the anode terminal that is equal to or greater than the pinch-off voltage of the JFET and the forward current path of the Schottky diode is put in a non-conducting state by the application of a voltage to the gate terminal relative to the anode terminal that is less than the pinch-off voltage of the JFET.

2. The JFET controlled Schottky diode of claim 1, wherein the forward current path between the first region and the second region has a vertical component relative to the top surface of the semiconductor layer, the third region being disposed to enclose a portion of the vertical component of the forward current path.

3. The JFET controlled Schottky diode of claim 1, wherein the forward current path between the first region and the second region has a horizontal component relative to the top surface of the semiconductor layer, the third region being disposed to enclose a portion of the horizontal component of the forward current path.

4. The JFET controlled Schottky diode of claim 1, further comprising a second metal electrode formed on the top surface of the semiconductor layer and in ohmic contact with the second region, the second metal electrode forming the cathode terminal of Schottky diode.

5. The JFET controlled Schottky diode of claim 1, wherein the semiconductor layer comprises an epitaxial layer of N-type conductivity formed on a semiconductor substrate of P-type conductivity.

6. The JFET controlled Schottky diode of claim 5, wherein the first region comprises an N-Well region formed in the epitaxial layer.

7. The JFET controlled Schottky diode of claim 6, further comprising:

a buried layer of N-type conductivity formed partially in the semiconductor substrate and partially in the epitaxial layer, the buried layer being positioned underneath and spaced apart from the N-Well region forming the first region; and a sinker region of N-type conductivity formed in the epitaxial layer, the third region being formed in the sinker region, the sinker region being in contact with and electrically coupled to the buried layer, wherein the forward current path from the first region to the second region comprises a current path from the N-Well, through the epitaxial layer under the N-Well, to the buried layer where the current is collected by the sinker region and provided to the cathode terminal formed by the second region.

8. The JFET controlled Schottky diode of claim 7, wherein the third region of P-type conductivity comprises:

a first p-type diffusion region formed in the epitaxial layer and between the N-Well and the buried layer, the first p-type diffusion region extending partially under the N-well to enclose a portion of the forward current path of the Schottky diode that lies in the epitaxial layer between the N-Well and the buried layer;

a second p-type diffusion region formed in the epitaxial layer, the second p-type diffusion region being in contact with and electrically coupled to the first p-type diffusion region, a third p-type diffusion region formed on the top surface of the epitaxial layer and in the second p-type diffusion region, the third p-type diffusion region being heavily doped, the first metal electrode being in ohmic contact with the third p-type diffusion region, wherein the forward current path enclosed by the first p-type diffusion region has a first diameter and the pinch-off voltage of the JFET is a function of the first diameter and the doping concentration of the epitaxial layer.

9. The JFET controlled Schottky diode of claim 8, wherein the first p-type diffusion region extends at least partially into the bottom of the N-well and encloses a portion of the forward current path of the Schottky diode that lies in the bottom of the N-well and in the epitaxial layer between the N-Well and the buried layer, and wherein the pinch-off voltage of the JFET is a function of the first diameter and the doping concentration of the epitaxial layer and the N-Well.

10. The JFET controlled Schottky diode of claim 8, wherein the first p-type diffusion region comprises an ISOUP region in a fabrication process, the second p-type diffusion region comprises a P-Well in the fabrication process, and the third region comprises a p+region in the fabrication process.

11. The JFET controlled Schottky diode of claim 10, wherein the fabrication process comprises one of a BCD, BiCMOS, Bipolar, or CMOS fabrication process.

12. The JFET controlled Schottky diode of claim 6, further comprising:

a buried layer of N-type conductivity formed partially in the semiconductor substrate and partially in the epitaxial layer, the buried layer being positioned underneath and spaced apart from the N-Well region forming the first region; and a sinker region of N-type conductivity formed in the epitaxial layer, the third region being formed in the sinker region, the sinker region being in contact with and electrically coupled to the buried layer, wherein the forward current path from the first region to the second region comprises a current path from the N-Well, through the epitaxial layer on the sides of the N-Well, to the sinker region directly or to the buried layer where the current is collected by the sinker region, the sinker region providing the current to the cathode terminal formed by the second region.

13. The JFET controlled Schottky diode of claim 12, wherein the third region of P-type conductivity comprises:

a first p-type diffusion region formed in the epitaxial layer and between the N-Well and the buried layer, the first p-type diffusion region extending across the entire bottom surface of the N-well and having a first portion that extends outside of the N-well;

a second p-type diffusion region formed in the epitaxial layer and being positioned above of and spaced apart from the first portion of the first p-type diffusion region, the second p-type diffusion region being electrically coupled to the first p-type diffusion region; and a third p-type diffusion region formed on the top surface of the epitaxial layer and in the second p-type diffusion region, the third p-type diffusion region being heavily doped, the first metal electrode being in ohmic contact with the third p-type diffusion region, wherein the first p-type diffusion region and the second p-type diffusion region encloses a portion of the forward current path of the Schottky diode that lies in the epitaxial layer from the sides of the N-Well to the sinker region and the buried layer, and wherein the forward current path enclosed by the first and second p-type diffusion regions has a first diameter and the pinch-off voltage of the JFET is a function of the first diameter and the doping concentration of the epitaxial layer.

14. The JFET controlled Schottky diode of claim 13, wherein the first p-type diffusion region comprises an ISOUP region in a fabrication process, the second p-type diffusion region comprises a P-drift region in the fabrication process, and the third region comprises a p+ region in the fabrication process.

15. The JFET controlled Schottky diode of claim 14, wherein the fabrication process comprises one of a BCD, BiCMOS, Bipolar, or CMOS fabrication process.

* * * * *